(12) United States Patent
Kim

(10) Patent No.: US 7,348,577 B2
(45) Date of Patent: Mar. 25, 2008

(54) METHOD FOR CONTROLLING A VAPORIZER OF ION IMPLANTATION EQUIPMENT DURING INDIUM IMPLANTATION PROCESS

(75) Inventor: Sang Bum Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 261 days.

(21) Appl. No.: 11/304,277

(22) Filed: Dec. 13, 2005

(65) Prior Publication Data

US 2006/0124868 A1    Jun. 15, 2006

(30) Foreign Application Priority Data

Dec. 14, 2004    (KR) .................... 10-2004-0105410

(51) Int. Cl.
*H01J 37/08* (2006.01)
*H01J 37/317* (2006.01)

(52) U.S. Cl. ................... 250/492.21; 250/425
(58) Field of Classification Search ............... None
See application file for complete search history.

(56) References Cited

U.S. PATENT DOCUMENTS

| | | | | |
|---|---|---|---|---|
| 6,107,634 A | * | 8/2000 | Horsky | 250/423 R |
| 6,497,744 B2 | * | 12/2002 | Yamashita | 75/10.29 |
| 6,570,166 B2 | * | 5/2003 | Yamashita | 250/425 |
| 2005/0040496 A1 | * | 2/2005 | Jain | 257/607 |

* cited by examiner

*Primary Examiner*—Jack I. Berman
(74) *Attorney, Agent, or Firm*—Andrew D. Fortney

(57) ABSTRACT

Disclosed is a method for controlling a vaporizer in ion implantation equipment during indium implantation process. The method comprises the steps of: (a) injecting a solid indium trichloride in a vaporizer; (b) raising a vaporizer temperature up to a first temperature at which water is able to be vaporized; (c) conditioning the vaporizer temperature in a temperature range between the first temperature and a second temperature at which the solid indium trichloride is able to be hydrolyzed, until water contained in the solid indium chloride can be removed; and (d) raising the vaporizer temperature up to a third temperature at which the indium trichloride is able to be vaporized.

15 Claims, No Drawings

METHOD FOR CONTROLLING A VAPORIZER OF ION IMPLANTATION EQUIPMENT DURING INDIUM IMPLANTATION PROCESS

This application claims the benefit of Korean Application No. 10-2004-0105410, filed on Dec. 14, 2004, which is hereby incorporated by reference in its entirety.

BACKGROUND OF THE INVENTION

1. Field of the Invention

The present invention relates to a semiconductor device manufacturing technology. More specifically, the present invention relates to a method for controlling a vaporizer used in an indium implantation process for implanting indium ions into a semiconductor wafer.

2. Description of the Related Art

Conventionally, a variety of ion beam technologies have been used for manufacturing integrated circuit devices. In general, ion beam technologies such as ion implantation, ion beam milling, reactive ion etching (RIE), etc., employ an ion beam from an ion source to be accelerated toward a target. The ion implantation is a standard technology for injecting dopants into a semiconductor wafer. Ion implantation is a kind of surface modification process in which ions are implanted into the near-surface region of the substrate, thereby changing the physical properties of the substrate.

Ion implantation equipment typically comprises an ion source, where ions of the desired element are produced; an accelerator, where the ions are electrostatically accelerated to a high energy; and a target chamber, where the ions impinge on a target, which is the material to be implanted. A source material is fed into the ion source in the form of a gas or solid according to its chemical and physical properties. Beam formation from a gas occurs by feeding a gas into the ion source. In the ion source, electrons, emitted from a hot filament, ionize the gas to form the plasma.

Forming a beam from a solid element (e.g., indium) can occur by a variety of methods. In one method that is commonly used in the semiconductor industry (typically demanding high-purity beams), a reactive gas, such as chlorine, is used to form the plasma. In addition, when using a solid element as source material, ion implantation equipment further comprises a vaporizer located adjacent to the ion source arc chamber. The solid element is sublimated in the vaporizer to be fed into the ion source arc chamber.

Contrary to other types of dopants, indium implantation uses a solid phase source material. Indium beams are generated using highly hygroscopic indium trichloride of which the fully hydrated form is $InCl_3 \cdot 4H_2O$. Especially in indium implantation, because indium trichloride generally includes a relatively large quantity of water, the vaporizer temperature must be carefully controlled to remove water. Otherwise, when the vaporizer temperature reaches about 230° C. (e.g., under a pressure of about 1 mTorr), a hydrolysis reaction as shown in Equation 1 may occur:

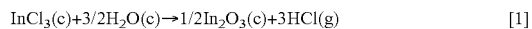

$$InCl_3(c) + 3/2 H_2O(c) \rightarrow 1/2 In_2O_3(c) + 3HCl(g) \qquad [1]$$

Referring to Equation 1, in order to prevent formation of HCl, it is necessary to remove water before a vaporizer temperature reaches at about 230° C.

In addition, the indium trichloride source material is typically injected into the vaporizer in the form of powder. The powders may be agglomerated due to water contained in the source material. Agglomeration of powers occasionally closes an injecting tube of the vaporizer, thus interrupting the supply of the source material.

SUMMARY OF THE INVENTION

It is, therefore, an object of the present invention to provide a method for removing water contained in solid indium trichloride, which is used as a source material in indium implantation process, thereby preventing the indium trichloride from reacting with water and being hydrolyzed.

Another object of the present invention is to provide a method for controlling a vaporizer in ion implantation equipment, thereby preventing agglomeration of powders of indium trichloride, which can close an injecting tube of the vaporizer due to water contained in highly hygroscopic indium trichloride.

To achieve the above objects, an embodiment of a method for controlling a vaporizer in ion implantation equipment during an indium implantation process, according to the present invention, may comprise the steps of: (a) injecting solid indium trichloride in a vaporizer; (b) raising a vaporizer temperature up to a first temperature at which water is able to be vaporized; (c) conditioning the vaporizer temperature in a temperature range between the first temperature and a second temperature at which the solid indium trichloride is able to be hydrolyzed, until water contained in the solid indium chloride is removed; and (d) raising the vaporizer temperature up to a third temperature at which the indium trichloride is able to be vaporized.

Here, step (c) can be performed by: raising the vaporizer temperature by a predetermined temperature interval from the first temperature to the second temperature; and maintaining the vaporizer temperature raised by the predetermined temperature interval until both temperature and pressure of the vaporizer are stabilized. Preferably, the first temperature is about 100° C. and the second temperature is about 250° C. In addition, the predetermined temperature interval can be about 10° C. Especially, step (c) is preferably performed under a pressure of 1E-15 Torr or less. Moreover, the third temperature can be between 330° C. and 380° C.

These and other aspects of the invention will become evident by reference to the following description of the invention.

DETAILED DESCRIPTION OF THE INVENTION

First, solid indium trichloride as a source material is prepared in the form of powder. The solid indium trichloride is highly hygroscopic, so that it generally has the fully hydrated form of $InCl_3 \cdot 4H_2O$. Powders of the solid indium trichloride are injected or otherwise placed into a vaporizer. It is noted that the present invention is also suitable for any hydrated solid indium source material, although indium chloride tetrahydrate $InCl_3 \cdot 4H_2O$ is a particularly suitable hydrated solid indium source material.

Then, a vaporizer temperature is raised up to a temperature of about 100° C. Preferably, the vaporizer temperature is maintained for about 5 minutes at 100° C. Because water is generally vaporized at about 100° C. (and at a lower temperature under vacuum, thus when the vaporizer is under vacuum, the first temperature may be less than 100° C.), a considerable quantity of water contained in the fully hydrated indium trichloride ($InCl_3 \cdot 4H_2O$) may be removed by maintaining the vaporizer temperature at 100° C. However, in order to completely remove the remainder of the water in the indium trichloride and to stabilize both temperature and pressure of the vaporizer chamber, a temperature-conditioning step is preferably performed in the following manner.

The temperature-conditioning step may be performed in a temperature range between the water vaporizing temperature (e.g., about 100° C.) and a temperature at which the solid indium trichloride is able to be hydrolyzed, until the water contained in the solid indium chloride is completely removed. The hydrolysis temperature of the solid indium trichloride is generally about 230° C. under a pressure of about 1 mTorr. However, the hydrolysis reaction may occur at about 250° C. in a typical environment in the vaporizer chamber.

More specifically, in the temperature-conditioning step, the vaporizer temperature is gradually raised or increased by a predetermined temperature interval (e.g., about 10° C.) per unit time from the water vaporizing temperature to the hydrolysis temperature of the solid indium trichloride. Such temperature increases may be gradual (e.g., according to a linear temperature increase per unit time graph or plot) or stepwise (e.g., at the end of the unit time, the vaporizer temperature is increased by the temperature interval). When the vaporizer temperature is raised by the temperature interval, a pressure in the vaporizer chamber may increase and the vaporizer temperature may fluctuate. Accordingly, after the vaporizer temperature is raised by the temperature interval (e.g., 10° C.), the raised vaporizer temperature is preferably maintained until both temperature and pressure of the vaporizer are stabilized. Gradually raising (or stepping) the vaporizer temperature and maintaining it are repeated until the vaporizer temperature reaches the target hydrolysis temperature. During the temperature-conditioning step, the pressure of the vaporizer is preferably controlled to be under a pressure of 1E-15 Torr or less, although higher pressures may be employed (e.g., less than about 1 mTorr, less than about 0.1 mTorr, less than about 0.01 mTorr, less than about 0.001 mTorr, etc.).

After the conditioning step is finished, the vaporizer temperature is raised up to a temperature of between 330° C. and 380° C., at which the indium chloride is able to be vaporized. Of course, the indium chloride vaporization temperature may depend on the vaporizer pressure as well, according to a relationship between temperature and indium chloride vaporization pressure known to those skilled in the art.

As described above, in an indium implantation process, the source material may be in the form of solid powder, contrary to other types of dopants that are typically implanted into a semiconductor wafer. Especially, an indium ion beam is typically generated from highly hygroscopic indium trichloride. The present invention can effectively remove water contained in the indium trichloride, thereby preventing the indium trichloride from reacting with water and being hydrolyzed.

Furthermore, the present invention can prevent agglomeration of powders of indium trichloride, which can close an injecting tube of the vaporizer due to water contained in highly hygroscopic indium trichloride.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for controlling a vaporizer in ion implantation equipment during an indium implantation process, comprising the steps of:
    injecting solid indium trichloride into a vaporizer;
    raising a vaporizer temperature to a first temperature at which water is able to be vaporized;
    conditioning the vaporizer temperature in a temperature range between the first temperature and a second temperature at which water contained in the solid indium chloride is removed; and
    raising the vaporizer temperature up to a third temperature at which the indium trichloride is able to be vaporized.

2. The method of claim 1, wherein conditioning the vaporizer temperature comprises: raising the vaporizer temperature by a predetermined temperature interval from the first temperature to the second temperature; and maintaining the vaporizer temperature at the second temperature until both temperature and pressure of the vaporizer are stabilized.

3. The method of claim 1, wherein the first temperature is about 100° C.

4. The method of claim 1, wherein the second temperature is about 250° C.

5. The method of claim 2, wherein the predetermined temperature interval is about 10° C.

6. The method of claim 1, wherein conditioning the vaporizer temperature is performed under a pressure of 1E-15 Torr or less.

7. The method of claim 1, wherein the third temperature is between 330° C. and 380° C.

8. The method of claim 1, wherein the step of conditioning the vaporizer temperature is performed until water in the solid indium trichloride is substantially removed.

9. The method of claim 1, wherein the step of conditioning the vaporizer temperature is performed under a pressure of 1 mTorr or less.

10. The method of claim 2, wherein the step of conditioning the vaporizer temperature is performed under a pressure of 1 mTorr or less.

11. A method for removing water from a hydrated solid indium source material, comprising the steps of:
    raising a temperature of a vaporizer in an ion implantation apparatus to a water vaporization temperature;
    raising the vaporizer temperature to a water removal temperature at which water in the solid indium source material can be removed; and
    raising the vaporizer temperature up to an indium source material vaporization temperature.

12. The method of claim 11, further comprising injecting the solid indium source material into a vaporizer.

13. The method of claim 11, wherein the solid indium source material comprises indium trichloride.

14. An apparatus for implanting indium ions, comprising:
    a vaporizer adapted to heat a hydrated solid indium source material; and
    a temperature controller adapted to raise the vaporizer temperature to a water vaporization temperature, a water removal temperature at which water in the solid indium source material can be removed, and an indium source material vaporization temperature at which the indium source material can be vaporized.

15. The apparatus of claim 14, further comprising an injecting tube configured to introduce the indium source material into the vaporizer.

* * * * *